(12) United States Patent
Yoneda et al.

(10) Patent No.: US 6,693,337 B2
(45) Date of Patent: Feb. 17, 2004

(54) SEMICONDUCTOR PHOTODETECTION DEVICE

(75) Inventors: Yoshihiro Yoneda, Yamanashi (JP); Ikuo Hanawa, Yamanashi (JP)

(73) Assignee: Fujitsu Quantum Devices Limited, Yamanashi (JP)

(*) Notice: Subject to any disclaimer, the term of this patent is extended or adjusted under 35 U.S.C. 154(b) by 81 days.

(21) Appl. No.: 10/015,681

(22) Filed: Dec. 17, 2001

(65) Prior Publication Data
US 2002/0113282 A1 Aug. 22, 2002

(30) Foreign Application Priority Data
Dec. 19, 2000 (JP) .......................................... 2000-386036
Sep. 28, 2001 (JP) .......................................... 2001-302109

(51) Int. Cl.[7] .......................................... H01L 31/0232
(52) U.S. Cl. .................. 257/436; 257/431; 257/446; 257/452; 257/458; 257/462
(58) Field of Search ............................ 257/431, 436, 257/446, 452, 458, 462

(56) References Cited

U.S. PATENT DOCUMENTS

| | | | | |
|---|---|---|---|---|
| 4,442,444 A | * | 4/1984 | Osaka ......................... | 357/13 |
| 4,455,351 A | * | 6/1984 | Camlibel et al. .......... | 428/450 |
| 4,481,523 A | * | 11/1984 | Osaka et al. ................ | 357/30 |
| 4,740,819 A | * | 4/1988 | Ouchi et al. ................. | 357/13 |
| 4,974,061 A | * | 11/1990 | Torikai ........................ | 357/30 |
| 4,992,386 A | * | 2/1991 | Furuyama et al. ............. | 437/3 |
| 5,001,335 A | * | 3/1991 | Takaoka et al. ............ | 250/211 |
| 5,053,837 A | * | 10/1991 | Tonai .......................... | 357/17 |
| 5,057,891 A | * | 10/1991 | Torikai ........................ | 357/30 |
| 5,114,866 A | * | 5/1992 | Ito et al. ........................ | 437/3 |
| 5,214,276 A | * | 5/1993 | Himoto et al. ........... | 250/214.1 |
| 5,671,914 A | * | 9/1997 | Kalkhoran et al. ............ | 257/77 |
| 6,399,967 B1 | * | 6/2002 | Matsuda ..................... | 257/184 |

FOREIGN PATENT DOCUMENTS

JP 05-082830 * 4/1993 ................. 257/436

* cited by examiner

Primary Examiner—George Eckert
Assistant Examiner—Edgardo Ortiz
(74) Attorney, Agent, or Firm—Westerman, Hattori, Daniels & Adrian, LLP

(57) ABSTRACT

A semiconductor photodetection device includes a semiconductor structure including an optical absorption layer having a photo-incidence surface on a first side thereof, a dielectric reflecting layer formed on a second side of the semiconductor structure opposite to the first side, a contact electrode surrounding the dielectric reflecting layer and contacting with the semiconductor structure, and a close contact electrode covering the dielectric reflecting layer and contacting with the contact electrode and the dielectric reflecting layer, wherein the close contact electrode adheres to the dielectric reflecting layer more strongly than to the contact electrode.

16 Claims, 16 Drawing Sheets

SEMICONDUCTOR PHOTODETECTION DEVICE

CROSS-REFERENCE TO RELATED APPLICATION

The present application is based on Japanese priority applications No. 2001-302109 filed on Sep. 28, 2001 and No. 2000-386036 filed on Dec. 19, 2000, the entire contents of which are hereby incorporated by reference.

BACKGROUND OF THE INVENTION

The present invention generally relates to optical semiconductor devices and more particularly to a semiconductor photodetection device used especially for fiber optics communication system.

FIG. 1 shows in general the structure of a conventional semiconductor photodetection device 10 of the type that receives incoming optical signal at a substrate surface side.

Referring to FIG. 1, the semiconductor photodetection device 10 is constructed on a substrate 11 of n-type InP, and includes a layer structure having an n-type InGaAs optical absorption layer 12 with low carrier concentration formed on the substrate 11 and a cap layer 13 of n-type InP formed on the layer 12. A p-type InGaAs region 16 and p-type InP region 15 are formed in the InGaAs optical absorption layer 12 and the n-type InP cap layer 13 by introducing a p-type impurity through an opening, which has been patterned in a dielectric protection layer 14 formed on the cap layer 13. An n-type electrode 17 is formed on the n-type InP substrate 11 and a p-type contact electrode 18 is formed on the p-type InP region 15, respectively. In the n-type electrode 17 is formed an optical window, through which an optical signal passes. In this illustrated embodiment, an antireflection film 19 is formed at the optical window on the substrate 11.

In operation of the photodetection device 10 shown in FIG. 1, a reverse bias voltage is applied between the electrodes 17 and 18. Under this condition, an optical signal having a wavelength of 1260–1620 nm used for fiber optics communication enters into the substrate 11 through the optical window. Because the substrate InP layer 11 is transparent to the light having the above wavelength, the incident signal light reaches the InGaAs optical absorption layer 12 without being absorbed by the substrate 11, and there occurs excitation of photocarriers in the optical absorption layer 12.

The frequency response of such a semiconductor photodetection device is generally determined by a time constant CR and a transit time of the carrier excited by the incident light, where C is a capacitance and R is an internal resistance of the device. In order to improve the frequency response of the semiconductor photodetection device 10, the time constant needs to be shortened and the carrier transit time also needs to be shortened. Because the carrier transit time increases proportionally to the thickness of the InGaAs optical absorption layer 12, it should be reduced in thickness, as much as possible in order to shorten the carrier transit time to improve the frequency response.

However, if the thickness of the InGaAs optical absorption layer 12 is reduced with the aim of achieving high speed, the optical absorption layer 12 can not absorb the incident light sufficiently, which degrades the quantum efficiency of the optical absorption.

Thus, because there exists a trade-off relationship between the frequency response and the quantum efficiency, it is difficult to obtain the optimum thickness of the InGaAs optical absorption layer 12 when designing semiconductor photodetection devices requiring high-speed response.

In order to solve this efficiency problem, in the conventional semiconductor photodetection device 10 of the substrate-side incident type shown in FIG. 1, the signal light that has not been absorbed by the optical absorption layer 12 is reflected by the p-type contact electrode 18 and re-introduced into the optical absorption layer 12 through the InP cap layer 13 to avoid the reduction in the quantum efficiency.

In the semiconductor photodetection device 10 shown in FIG. 1, while a metal layer constituting the contact electrode 18 is vapor-deposited on the n-type InP cap layer 13, heat resulting from the vapor-deposition forms an alloy metal layer at the interface between the InP cap layer 13 and the metal contact electrode 18. As a result, the planarity of the interface between the InP cap layer 13 and the contact electrode 18 is degraded. This degradation of planarity significantly lowers the reflectivity of the interface and reduces the amount of the signal light reflected by the interface, and therefore the signal light is mostly scattered by the interface and cannot be absorbed well enough in the InGaAs optical absorption layer 12. Consequently, the quantum efficiency is lowered and the amount of light returning from the photodetection device 10 to an optical fiber is increased, resulting in lower the transmission characteristics of fiber optics communication system.

In order to deal with the above mentioned problem, there has been a proposal, in Japanese Laid-Open Patent Publication 5-218488, that a dielectric layer 20 be interposed between the cap layer 13 and the contact electrode 18 as shown in FIG. 2, and would inhibit the alloying reaction between the metal layer of the contact electrode 18 and the InP layer of the cap layer 13. Similar or the same parts in FIG. 2 corresponding to the previously described parts in FIG. 1 are designated by the same reference numerals and the description thereof will be omitted.

This conventional structure of the substrate side incident type semiconductor photodetection device shown in Japanese Laid-Open Patent Publication 5-218488, however, has suffered from problem in that the contacting area between the contact electrode 18 and the InP cap layer 13 is reduced because of the dielectric layer 20, and the adherence between the metal layer of the contact electrode 18 and the dielectric layer 20 is not strong enough. Therefore, there has been a problem that the contact electrode 18 peels off during the manufacturing process, wire bonding process or flip chip mounting process.

SUMMARY OF THE INVENTION

Accordingly, it is a general object of the present invention to provide a novel and useful semiconductor photodetection device wherein the foregoing problems are eliminated.

Another and more specific object of the present invention is to provide a reliable semiconductor photodetection device having high speed response and high efficiency.

Another object of the present invention is to provide a semiconductor photodetection device, comprising:

a semiconductor structure including an optical absorption layer having a photo-incidence surface on a first side thereof;

a dielectric reflecting layer formed on a second side of the semiconductor structure opposite to the first side;

a contact electrode surrounding the dielectric reflecting layer and contacting with the semiconductor structure; and a close contact electrode covering the dielectric reflecting layer and contacting with the contact electrode and the dielectric reflecting layer, the close contact electrode adhering to the dielectric reflecting layer more strongly than to the contact electrode.

Another object of the present invention is to provide a semiconductor photodetection device, comprising:

a semiconductor structure including an optical absorption layer having a photo-incidence surface on a first side thereof;

a dielectric reflecting layer formed on a second side of the semiconductor structure opposite to the first side;

a contact electrode surrounding the dielectric reflecting layer and contacting with the semiconductor structure;

a dielectric coating layer surrounding the contact electrode; and a close contact electrode covering the contact electrode and the dielectric coating layer and contacting with the contact electrode and the dielectric coating layer, the close contact electrode adhering to the dielectric coating layer more strongly than to the contact electrode.

It is preferable to form the semiconductor photodetection device so that the dielectric reflecting layer and the dielectric coating layer are made of fluoride, oxide or nitride including one or more atoms selected from the group consisting of Si, Al, Mg, Ti, Zr and Ta.

Another object of the present invention is to provide a semiconductor photodetection device, comprising:

a semiconductor structure including an optical absorption layer having a photo-incidence surface on a first side thereof;

a dielectric reflecting layer formed on a second side of the semiconductor structure opposite to the first side;

a contact electrode surrounding the dielectric reflecting layer and contacting with the semiconductor structure; and a metal reflecting layer formed within a region inside the contact electrode;

wherein reactivity of the metal reflecting layer with semiconductor material of the semiconductor structure is lower than reactivity of the contact electrode with the semiconductor material.

It is preferable to form the semiconductor photodetection device so that the metal reflecting layer includes transition metal belonging to any group of groups 3B through 8B. Further, it is preferable to form the semiconductor photodetection device so that the metal reflecting layer includes one or more atoms selected from the group consisting of Pt, Ni, TiW and TiN. Further, it is preferable to form the semiconductor photodetection device so that the metal reflecting layer comprises a first metal reflecting layer having a thickness thinner than the absorption length at the signal light wavelength, and a second metal reflecting layer on the first metal reflecting layer. Further, it is preferable to form the semiconductor photodetection device so that the first metal reflecting layer includes transition metal belonging to any group of groups 3B through 8B and the second metal reflecting layer includes transition metal belonging to group 1B or 2B. Further, it is preferable to form the semiconductor photodetection device so that the first metal reflecting layer includes one or more elements selected from the group consisting of Pt, Ni, TiW and TiN, and the second metal reflecting layer includes one or more atoms selected from the group consisting of Au, Ag and Cu.

Another object of the present invention is to provide a semiconductor photodetection device, comprising:

a semiconductor structure including an optical absorption layer having a photo-incidence surface on a first side thereof;

a dielectric reflecting layer formed on a second side of the semiconductor structure opposite to the first side;

a contact electrode surrounding the dielectric reflecting layer and contacting with the semiconductor structure;

a barrier electrode formed on the periphery of the dielectric reflecting layer; and a reflecting electrode covering the dielectric reflecting layer and contacting with the barrier electrode and the dielectric reflecting layer.

It is preferable to form the semiconductor photodetection device so that the dielectric reflecting layer is made of fluoride, oxide or nitride including one or more atoms selected from the group consisting of Si, Al, Mg, Ti, Zr and Ta. Further, it is preferable to form the semiconductor photodetection device so that the close contact electrode is made of Ti or Al. Further, it is preferable to have one or more additional reflecting layers made of dielectric or semiconductor on the dielectric reflecting layer. Further, it is preferable to form the semiconductor photodetection device so tat the additional reflecting layers are dielectric layers comprising fluoride, oxide or nitride including one or more atoms selected from the group consisting of Si, Al, Mg, Ti, Zr and Ta, or semiconductor layers including Si or Ge. Further, it is preferable to form the semiconductor photodetection device so that the dielectric reflecting layer has a refractive index of $n_1$ and the additional reflecting layers has a refractive index of $n_2$, where $n_2 > n_1$. Further, it is preferable to form the semiconductor photodetection device so that the close contact electrode performs at least partially a function of reflecting incident light. Further, it is preferable to form the semiconductor photodetection device so that the additional reflecting electrode includes transition metal belonging to group 1B or 2B. Further, it is preferable to form the semiconductor photodetection device so that the additional reflecting layer includes one or more atoms selected from the group consisting of Au, Ag and Cu. Further, it is preferable to form the semiconductor photodetection device so that the metal reflecting layer comprises a first metal reflecting layer having a thickness less than the absorption length at the signal light wavelength, and a second metal reflecting layer on the first metal reflecting layer. Further, it is preferable to form the semiconductor photodetection device so that the first metal reflecting layer includes transition metal belonging to any of groups 3B through 8B and the second metal reflecting layer includes transition metal belonging to group 1B or 2B. Further, it is preferable to form the semiconductor photodetection device so that the first metal reflecting layer includes one or more elements selected from the group consisting of Pt, Ni, TiW and TIN, and the second metal reflecting layer includes one or more atoms selected from the group consisting of Au, Ag and Cu. Further, it is preferable to form the semiconductor photodetection device so that the barrier electrode has a larger area than the contact electrode. Further, it is preferable to form the semiconductor photodetection device so that the contact electrode is a ring shape. Further, it is preferable to form the semiconductor photodetection device so that the contact electrode is formed partially surrounding the dielectric reflecting layer. Further, it is preferable to form the semiconductor photodetection device so that the semiconductor structure is mounted on a semiconductor substrate and the photo-incidence surface is placed on the substrate side of the semiconductor structure. Further, it is preferable to form the semiconductor photodetection device so that the semiconductor structure is mounted on a semiconductor substrate and the photo-incidence surface is placed on a side opposite to the substrate of the semiconductor structure. Further, it is preferable to form the semiconductor photodetection device so that the semiconductor structure further includes a carrier-multiplier layer, and the semiconductor photodetection device is an avalanche photodiode.

According to the present invention, it becomes possible to improve the total adherence of the electrode by having a dielectric reflecting layer inside the contact electrode and by having a close contact electrode mounted on the dielectric protection layer outside of the contact electrode, wherein the close contact electrode is made of high adhesive metal. As a result, it becomes possible to avoid a problem that the contact electrode peels off during manufacturing process, wire bonding process or flip chip mounting process. Further, it becomes possible to improve the planarity and reflectivity of a reflecting surface by having a metal reflecting layer inside the contact electrode wherein the metal reflecting layer has low reactivity with a semiconductor layer. Further, it becomes possible to obtain a high reflective mirror with thin layers by using a metal layer as a reflective layer. As a result, it becomes possible to improve step coverage, throughput and reliability of semiconductor photodetection device.

Other objects and further features of the present invention will become apparent from the following detailed description when read in conjunction with the attached drawings.

DETAILED DESCRIPTION OF THE INVENTION

[First embodiment]

Figure 3:
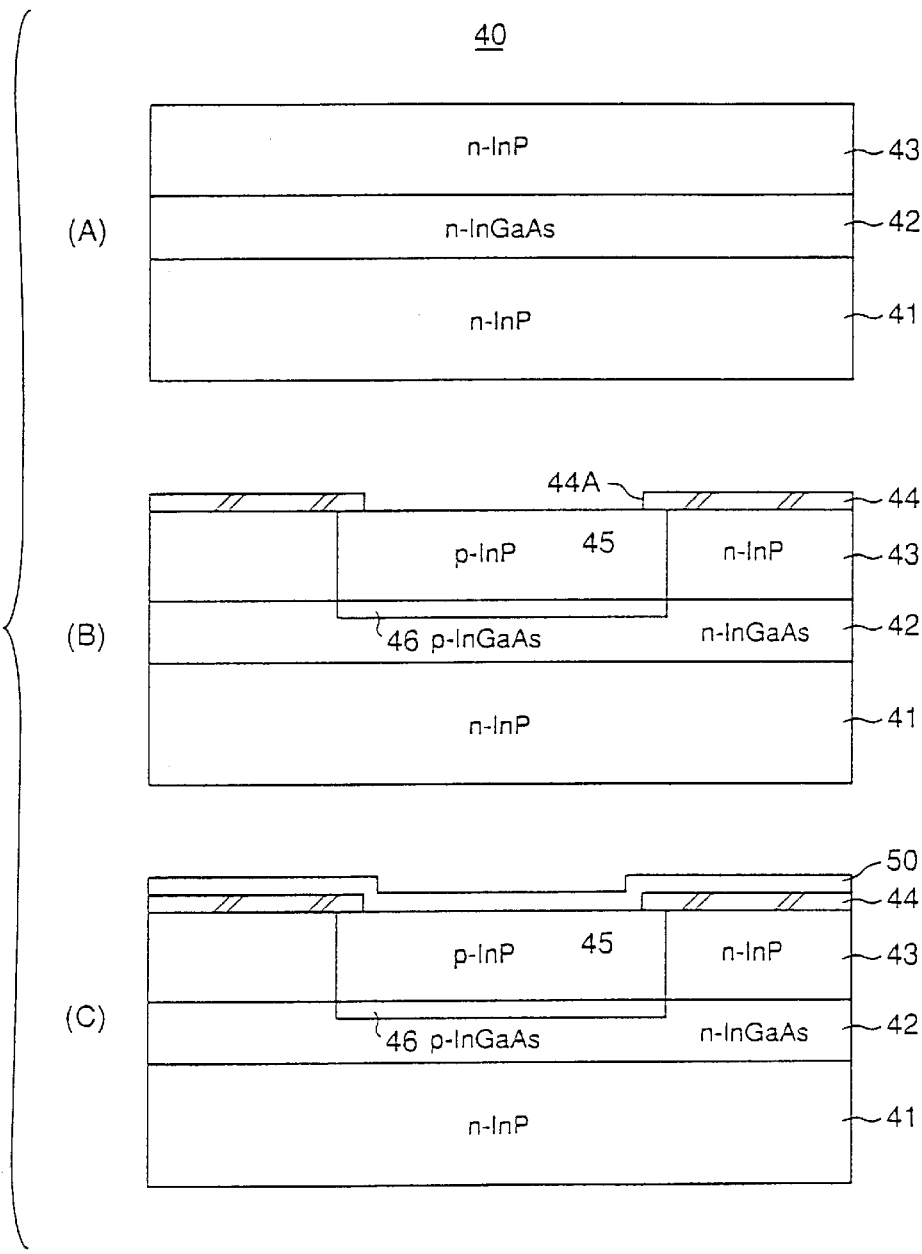
FIG. 3 shows manufacturing steps of a semiconductor photodetection device according to a first embodiment of the present invention.
Figure 5:
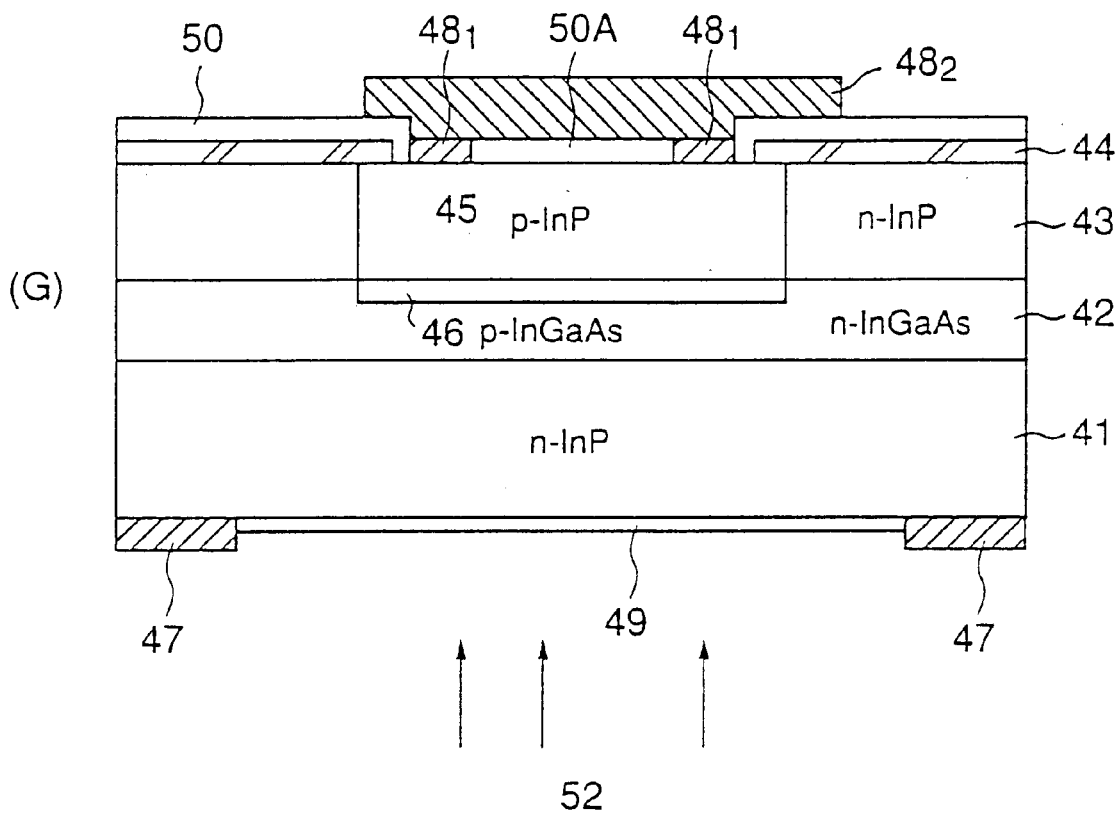
FIG. 5 is a cross-sectional view showing the construction of the semiconductor photodetection device according to the first embodiment of the present invention.

FIG. 3-(A) through FIG. 5-(G) show manufacturing steps of a semiconductor photodetection device 40 according to a first embodiment of the present invention.

Referring to FIG. 3-(A), the semiconductor photodetection device 40 is constructed on a substrate 41 of n-type InP, and includes an n-type InGaAs layer 42 formed epitaxially on the substrate 41 and having a carrier concentration of $5.5 \times 10^{14}$ cm$^{-3}$ and a thickness of 2 µm, and an n-type InP layer 43 formed epitaxially on the InGaAs layer 42 and having a carrier concentration of $3 \times 10^{15}$ cm$^{-3}$ and a thickness of 1.4 µm. The InGaAs layer 42 and InP layer 43 are typically formed by the MOVPE method, but can be formed by other crystal growth technologies such as the MBE method.

Referring to FIG. 3-(B), a dielectric protection layer 44 typically made of SiN is formed on the InP layer 43 by the CVD method or other deposition technologies such as sputtering and electron-beam evaporation, and an opening 44A is made in the dielectric protection layer 44 by photolithograpic process. A p-type impurity is introduced into the InP layer 43 through the opening 44A by thermal diffusion or ion implantation. As a result, a p-type region 45 and a p-type InGaAs region 46 are formed corresponding to the opening 44A, in the n-type InP layer 43 and at the top surface of the n-type InGaAs layer 42. The p-type impurity may be Zn, Cd, Be or a like substance.

Figure 4:
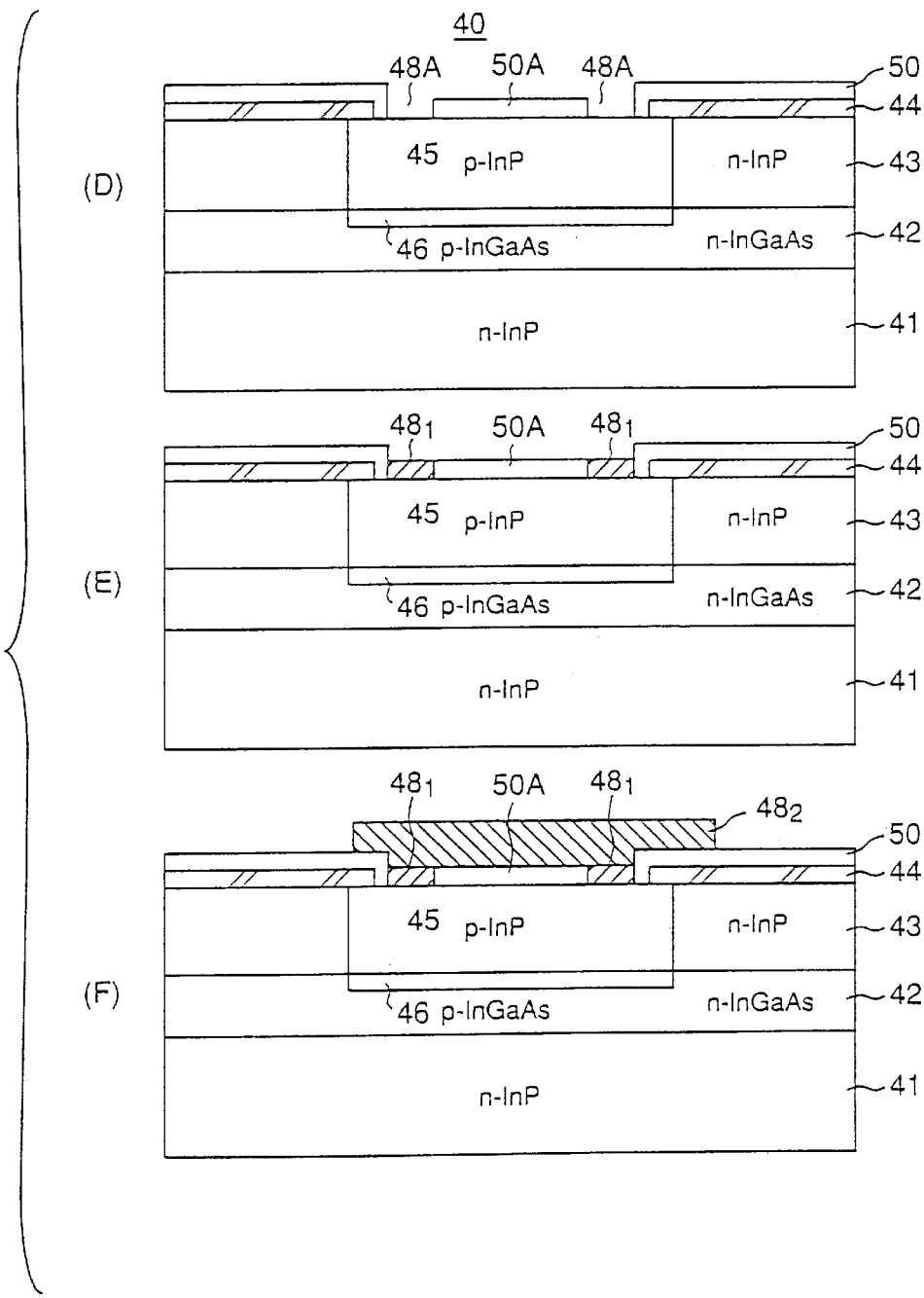
FIG. 4 shows subsequent manufacturing steps of the semiconductor photodetection device according to the first embodiment of the present invention.

Referring to FIG. 3-(C), a dielectric layer 50 made of SiN or a like substance is formed so that it covers the dielectric protection layer 44 and the p-type InP region 45 at the opening 44A. Then the dielectric layer 50 is patterned by photolithographic process as shown in FIG. 4-(D), to form a dielectric layer pattern 50A on an exposed surface of the InP layer 45. As the dielectric layer pattern 50A is formed, a ring-shaped opening 48A is made around the pattern 50A to partially expose the top surface of the p-type InP region 45.

In a subsequent step shown in FIG. 4-(E), a ring-shaped contact electrode $48_1$ having an Au/Zn/Au layer structure is formed in the ring-shaped opening 48A, by using a vapor deposition process such as resistance heating vacuum vapor deposition or electron-beam evaporation, and a lift-off process. Further, the thus formed ring-shaped contact electrode $48_1$ is heated to be alloyed.

Because an alloy layer is made at a ring-shaped interface area between the p-type InP region 45 and the ring-shaped contact electrode $48_1$ due to the heat process, the planarity of the InP layer 43 becomes worse at that area. However, the original planarity of the InP layer 43 is maintained at the area where the dielectric layer pattern 50A is formed, where a light signal which has passed through the InGaAs layer 42 reaches and can be reflected well.

Referring to FIG. 4-(F), a resist pattern having an opening exposing the ring-shaped contact electrode $48_1$ is made on the dielectric layer 50, a conducting layer made of Ti or Al is deposited on the resist pattern and lifted off, to form a close contact electrode $48_2$ which contacts with the ring-shaped contact electrode $48_1$ and the dielectric layer pattern 50A.

In the above steps, in spite of the heating alloying process of the contact electrode $48_1$, the interface between the dielectric layer pattern 50A and the n-type InP layer 43 maintains the original planarity because the dielectric layer pattern 50A does not react with InP.

Referring to FIG. 5-(G), a ring-shaped n-type electrode 47 and an antireflection film 49 are formed on the bottom surface of the n-type InP substrate 41. When a signal light is introduced into the substrate 41 through the antireflection film 49, the light signal light is partially absorbed by the InGaAs layer 42 and then reflected by the dielectric layer pattern 50A and returned back into the InGaAs layer 42. Because the planarity of the interface between the p-type InP region 45 and the dielectric layer pattern 50A is well maintained, high reflectivity is obtained and optical loss is minimized.

In this embodiment, the close contact electrode $48_2$ made of Ti or Al which is well attached by the dielectric layer pattern 50A or the dielectric layer 50, is formed both inside and outside the ring-shaped contact electrode $48_1$, therefore, the total adherence of the electrode including the ring-shaped contact electrode $48_1$ and the close contact electrode $48_2$ is much improved. As a result, this embodiment can avoid a problem that the contact electrode peels off during manufacturing process such as wire bonding process or mounting process.

Figure 1:
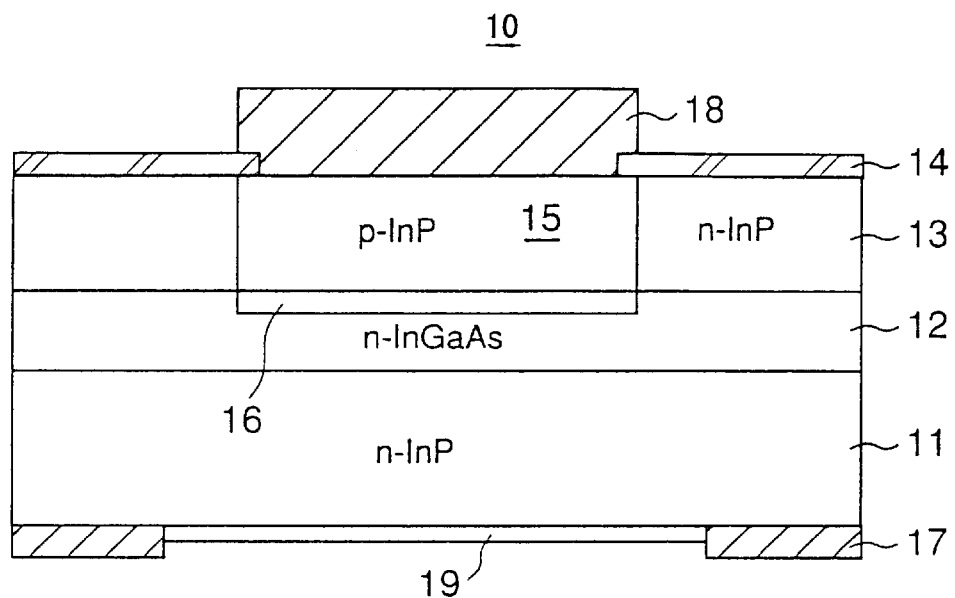
FIG. 1 is a cross-sectional view showing the construction of a conventional semiconductor photodetection device.
Figure 2:
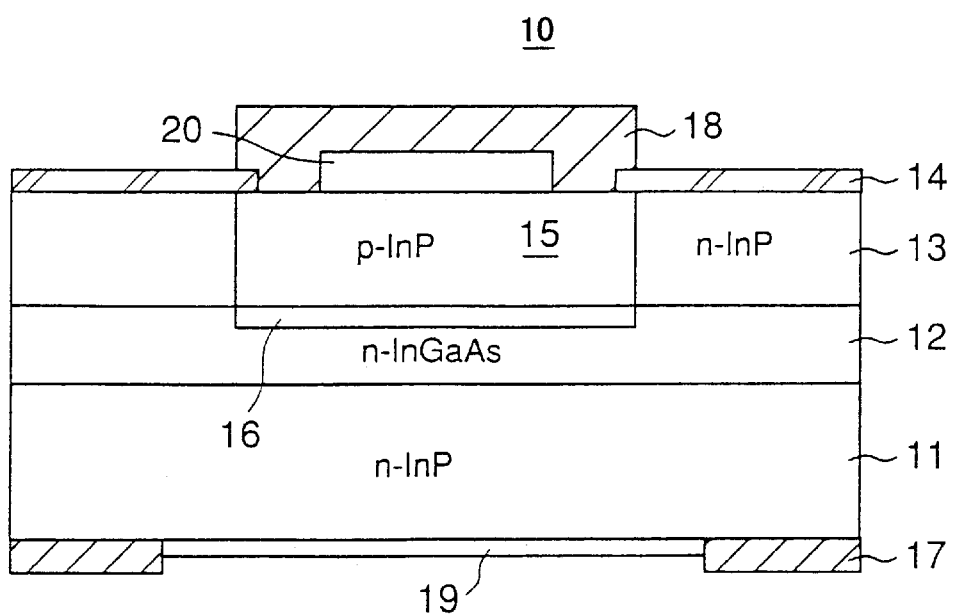
FIG. 2 is a cross-sectional view showing the construction of another conventional semiconductor photodetection device.

The following table comparatively shows the peeling-off rates of a semiconductor photodetection device according to this embodiment and a conventional device as shown in FIG. 2. These peeling-off rates were obtained by performing the tests 1000 times.

| Device | Peeling-off rate |
|---|---|
| Conventional device | >80% |
| This embodiment | <1% |

This table shows that the contact electrode peeled off in more than 80% of the tested conventional devices while the electrode peeled off in less than 1% of the tested photodetection devices according to this embodiment.

As mentioned above, it is possible to use Al instead of Ti as the close contact electrode $48_2$ in this embodiment. And it is also possible to use a fluoride layer or an oxide layer of Si, Al, Mg, Ti, Zr, Ta or similar substance instead of a SiN layer as the dielectric layer 50A.

The conductivity types can be reversed from p-type to n-type in this embodiment. The semiconductor layers 41–43 are not limited to III–V compound semiconductor materials and may be Si or Ge.

[Second embodiment]

The close contact electrode $48_2$ made of Ti is disposed on the dielectric pattern 50A placed inside the ring-shaped contact electrode $48_1$ in the previous embodiment.

Even though the interface between the p-type InP region 45 and the dielectric pattern 50A is planar, the signal light 52 may not be reflected by the dielectric layer 50A well enough when the reflectivity of the layer 50A is low. In that case, the light coming through the dielectric layer pattern 50A reaches the electrode $48_2$ and is absorbed there to degrade the absorption characteristics of the device.

Figure 6:
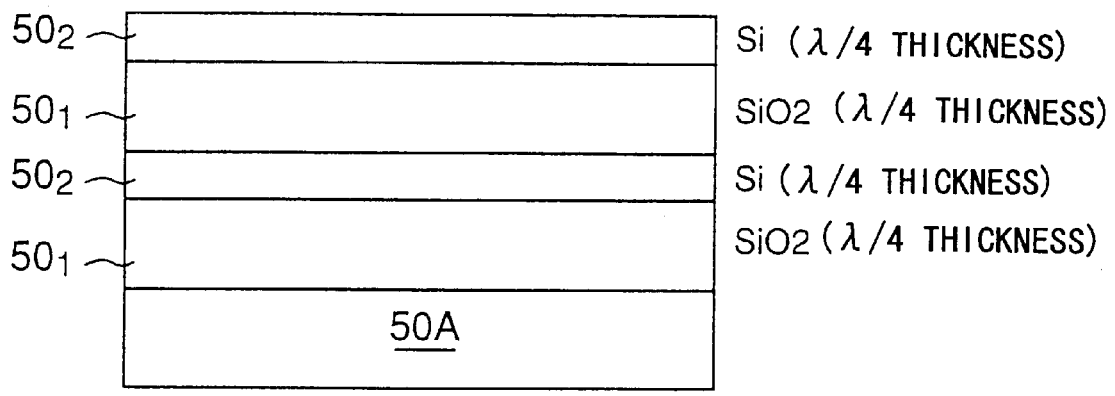
FIG. 6 is a cross-sectional view showing a part of a semiconductor photodetection device according to a second embodiment of the present invention.

This second embodiment has a λ (lambda)/4 multiple reflecting layer structure which is mounted on the dielectric layer pattern 50A. λ is an incident light wavelength. The λ (lambda)/4 multiple reflecting layer structure is formed by laminating $SiO_2$ layers $50_1$ and Si layers $50_2$ alternately as shown in FIG. 6. The total reflectivity of the laminated $SiO_2$ layers $50_1$ and Si layers $50_2$ can be increased to 100% by making each of the optical thicknesses of theses layers set up in ¼ of the wavelength of the incident light. As a result, it is possible to completely avoid the optical absorption by the Ti close contact electrode $48_2$.

Alternatively, the dielectric layer pattern 50A itself may have such a multiple layer structure shown in FIG. 6. Although the $SiO_2$ layers $50_1$ and Si layers $50_2$ are laminated twice in the embodiment shown in FIG. 6, these layers can be laminated even only once, or three or more times repeatedly. It is preferable to have a $SiO_2$ layer $50_1$ at the top of the laminated reflecting layers 50A in order to stabilize the structure. The λ (lambda)/4 multiple reflecting layer can be made of other combination materials such as a $SiO_2$ layer and a $TiO_2$ layer. And a Ge layer can be used instead of a Si layer.

[Third embodiment]

Figure 7:
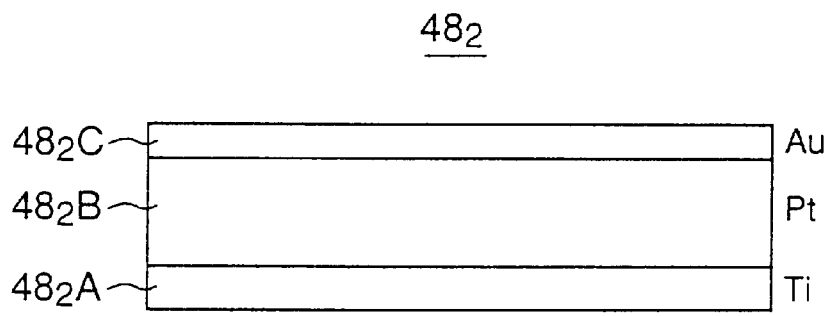
FIG. 7 is a cross-sectional view showing a part of a semiconductor photodetection device according to a third embodiment of the present invention.

FIG. 7 shows the construction of a close contact electrode $48_2$ according to a third embodiment of the present invention.

Referring to FIG. 7, the close contact electrode $48_2$ of this embodiment has a laminated structure including Ti layer $48_2$A, Pt layer $48_2$B and Au layer $48_2$C. The lowermost Ti layer $48_2$A can be well attached to the dielectric pattern 50A. On the other hand, the uppermost Au layer $48_2$C lowers the contact resistance and therefore the total resistance of the close contact electrode $48_2$. Further, the middle Pt layer $48_2$B interposed between Ti layer $48_2$A and Au layer $48_2$C suppresses interdiffusion between the lowermost layer $48_2$A and the uppermost layer $48_2$C.

In this structure shown in FIG. 7, the Ti layer $48_2$A constitutes only a small portion of the electrode $48_2$. The high reflective Pt layer $48_2$B and Au layer $48_2$C account for the major portion of the electrode $48_2$, and therefore the absorption of the light coming from the dielectric layer pattern 50A by the Ti layer can be minimized.

[Fourth embodiment]

Figure 8:
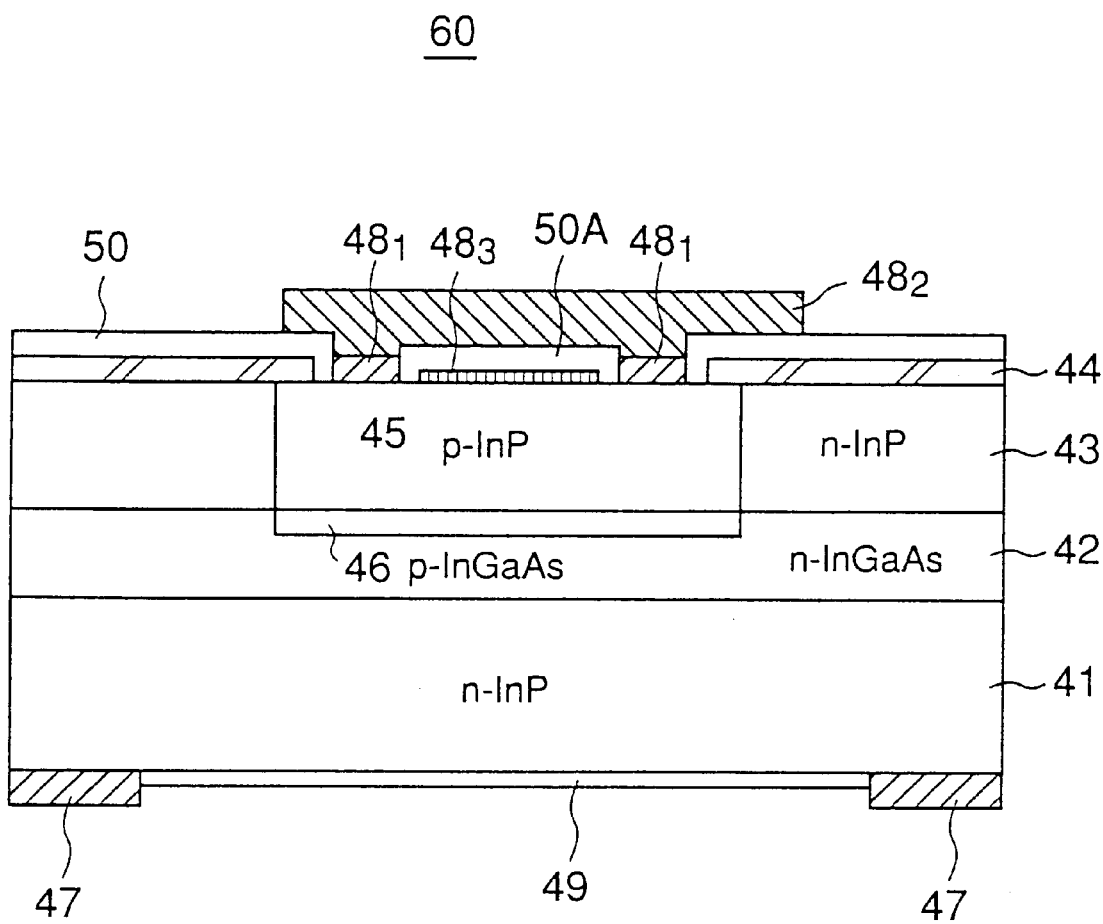
FIG. 8 is a cross-sectional view showing the construction of a semiconductor photodetection device according to a fourth embodiment of the present invention.

FIG. 8 shows the construction of a semiconductor photodetection device 60 according to a fourth embodiment of the present invention. Those parts corresponding to the parts described previously are designated by the same reference numerals and the description thereof will be omitted.

Referring to FIG. 8, the semiconductor photodetection device 60 has a structure similar to that of the previously explained semiconductor photo detection device 40, but is different from the device 40 in that the device 60 has a high reflecting pattern $48_3$ as a metal reflecting layer. The high reflecting metal layer $48_3$ is placed inside the ring-shaped contact electrode $48_1$ and covered with the dielectric pattern 50A, and is typically made of Pt, Ni, TiW or TiN.

In actual manufacturing process of the semiconductor photodetection device 60 as shown in FIG. 8, after the formation of the p-type InP region 45 in the step shown in FIG. 3-(B), the Pt pattern $48_3$ is formed on the InP layer 45 inside the opening 44A, and thereafter the dielectric layer 50 is deposited so as to cover the Pt pattern $48_3$.

The reflectivity of the dielectric pattern 50A having the multiple layer structure shown in FIG. 6 is improved as the repeating time of the layers is increased. However, the thickness of the multiple reflecting layer structure 50A is increased at the same time. Accordingly it becomes difficult to form the ring-shaped contact electrode $48_1$ in the FIG. 4-(E) step, because the ring-shaped opening 48A becomes deeper. On the other hand, according to this embodiment of the present invention, the reflecting pattern $48_3$ itself has high reflectivity, and therefore it is possible to obtain a high reflecting mirror of a small thickness without using the multiple reflecting layer 50A shown in FIG. 6.

According to this embodiment of the present invention, it is possible to make the dielectric layer 50 and 50A thinner, and therefore improve the regularity of the surface of the electrode structure formed on the InP layer 43. As a result, the step coverage problem when making the contact electrode $48_1$ and the close contact electrode $48_2$ is alleviated, resulting in improved throughput and reliability in the device manufacturing process.

[Fifth embodiment]

Figure 9:
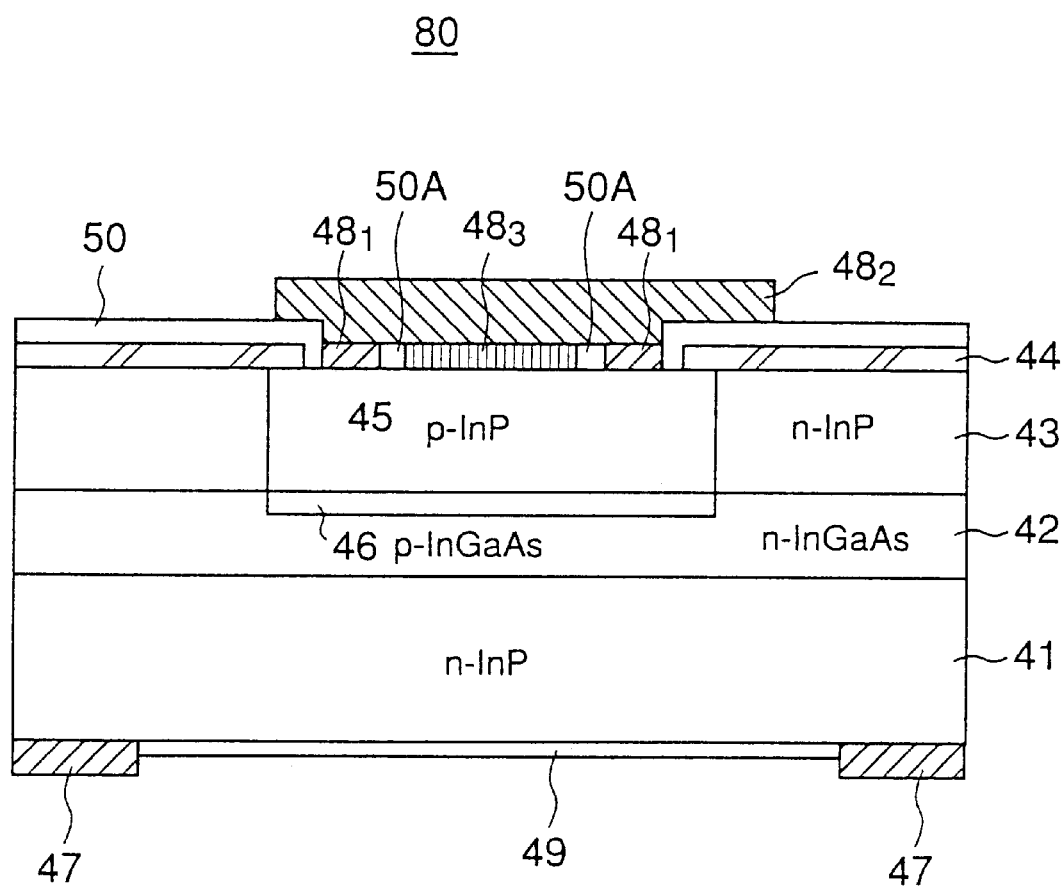
FIG. 9 is a cross-sectional view showing the construction of a semiconductor photodetection device according to a fifth embodiment of the present invention.

FIG. 9 shows the construction of a semiconductor photodetection device 80 according to a fifth embodiment of the present invention. Those parts corresponding to the parts described previously are designated by the same reference numerals and the description thereof will be omitted.

Referring to FIG. 9, the semiconductor photodetection device 80 has a structure similar to that of the previously explained semiconductor photo detection device 60, but is different from the device 60 in that the high reflecting pattern Pt $48_3$ in the device 80 directly contacts with the close contact electrode $48_2$. The dielectric pattern 50A is placed only in a ring-shaped area between the high reflecting pattern $48_3$ and the ring-shaped contact electrode $48_1$.

This dielectric layer pattern 50A does not necessarily have to function as a reflecting layer, and therefore can be omitted so that the high reflecting pattern $48_3$ contacts with the contact electrode $48_1$.

In this embodiment, because the high reflecting pattern $48_3$ is made of conductive material such as Pt, Ni, TiW, TiN or similar substance, its electric resistance is low and the frequency response of this device is improved.

Although the n-type electrode 47 is formed on the bottom surface of the substrate 41 in this embodiment, it can be alternatively placed on or above the top surface of the n-type InP layer 43 in order to obtain higher frequency response. In this case, solder bumps may be formed on the close contact electrode $48_2$ for flip chip mounting application.

Considerations of the material for the high reflecting pattern $48_3$ will be given below.

In order to improve the reflectivity of the reflecting pattern $48_3$ to nearly 100%, the pattern $48_3$ is preferably made of a transition metal element (so called noble metal) such as Au, Ag or Cu, belonging to group 1B or 2B. These metals, different from other transition metals, have an absorption edge wavelength of less than 0.6 $\mu$m by the total dielectric effect due to inter-band transition and free electrons, and therefore do not absorb light used for optical communication application.

On the other hand, these metals tend to become thermally diffused into semiconductor layers to create an alloy, and have inferior adhesive characteristics because they have only one or two most outer-shell electrons, and therefore the semiconductor photodetection device using these metals have reliability problem. Further, thermal stress causes other problems that the reflectivity varies and the adhesive strength cannot be maintained when attaching bonding wires or mounting the device on a circuit board.

For this embodiment of the present invention, the high reflecting pattern $48_3$ is made of materials including groups 3A–8A transition metal element such as Ti, having many most outer-shell electrons, in order to prohibit the metal diffusion into semiconductor layers and improve the adhesive strength. On the other hand, these metals belonging to groups 3A–8A exhibit strong absorption of light used for optical communication application from the visible region to the far infrared region due to transition in band, and may not achieve the desired high reflectivity.

In consideration of these problems, material including transition metal elements (such as Au, Ag and Cu) of group 1B or 2B is deposited on the high reflecting pattern $48_3$ made of a transition metal element of groups 3A–8A for this embodiment of the present invention. The thickness of the layer made of the transition metal elements belonging to groups 3A–8A is selected so as to be less than the absorption length at the signal light wavelength to minimize optical absorption.

The contact electrode $48_1$ is not limited to the ring-shape, and may be of other shapes that partially surround the reflecting pattern $48_3$.

Although the above embodiments were explained using a substrate side incident type of photodetection device, the present invention can be applied to a surface incident type of photodetection device.

[Sixth embodiment]

Figure 10:
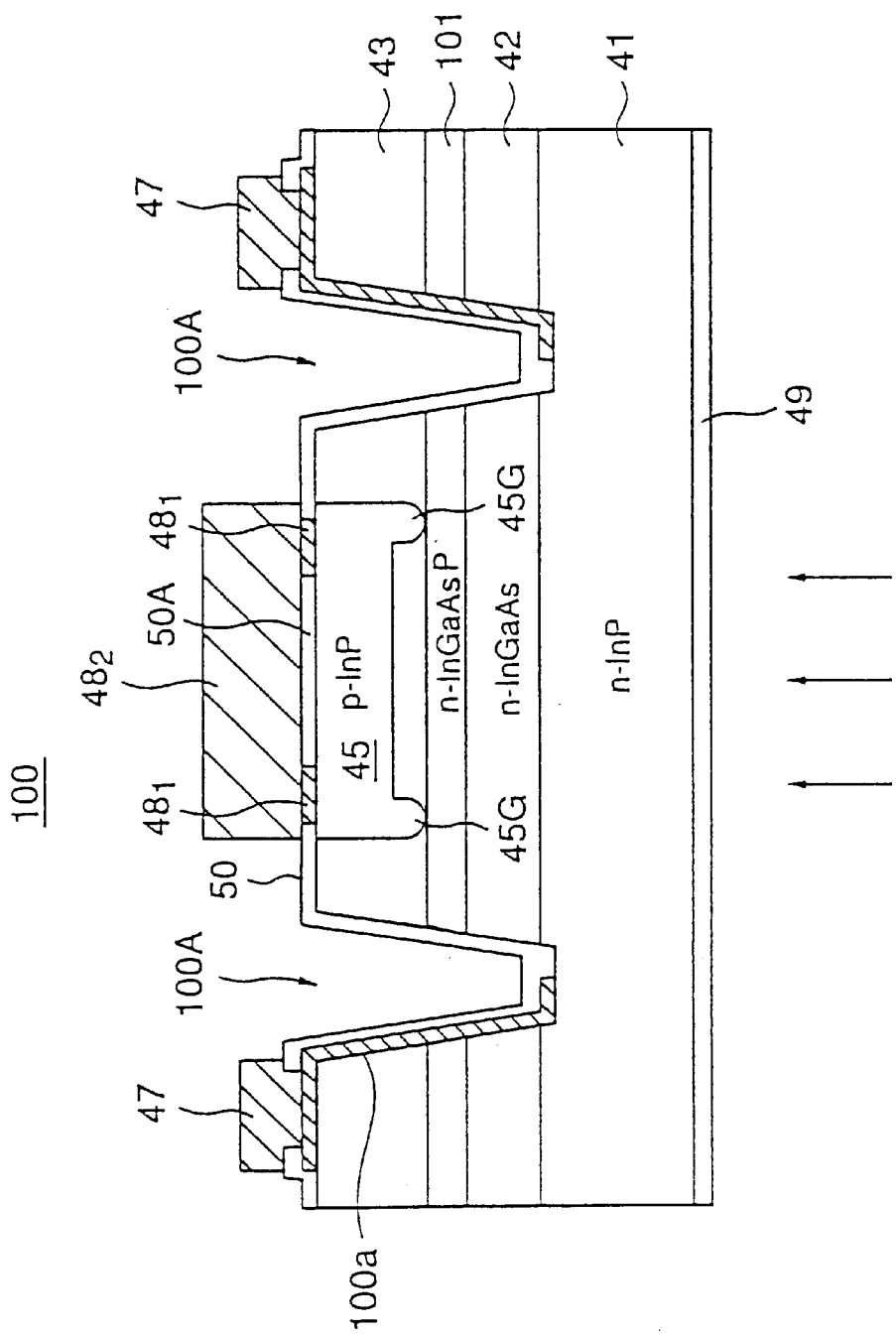
FIG. 10 is a cross-sectional view showing the construction of an avalanche photodiode according to a sixth embodiment of the present invention.

FIG. 10 shows the construction of a surface mounted type avalanche photodiode 100 according to a sixth embodiment of the present invention, wherein those parts corresponding to the parts described previously are designated by the same reference numerals and the description thereof will be omitted.

Referring to FIG. 10, the avalanche photodiode 100 has a general semiconductor layer construction similar to the previously described semiconductor photodetection devices 40–80, and includes an n-type InGaAs optical absorption layer 42 formed on an n-type InP substrate 41 and an n-type InP cap layer 43, and further includes an InGaAsP graded-composition layer 101 doped to n-type between the optical absorption layer 42 and the cap layer 43. A p-type region 45 is formed in the cap layer 43, and a p-type guard ring 45G surrounding the p-type region 45 is formed. The InP cap layer 43 functions as a photo multiplier layer in this embodiment.

The avalanche photodiode 100 according to this embodiment has a contact trench 100A dug through the InP cap layer 43 all the way to the substrate 41. A conductor pattern 100a exists from the bottom of the contact trench 100A to the top surface of the cap layer 43, in order to enable surface mounting.

On the surface of the InP cap layer 43, a dielectric layer 50 made of SiN or similar substance is formed so as to cover the conductor pattern 100a and the surface of the contact trench 100A. A dielectric layer pattern 50A is formed separated from the dielectric layer 50 by a ring-shaped opening 48A (See FIG. 4-(D)). A ring-shaped contact electrode $48_1$ is formed in the ring-shaped opening 48A.

Further, on the dielectric layer pattern 50A is formed a close contact electrode $48_2$ typically made of Ti or Al, having excellent adhesive strength to the dielectric layer pattern 50A.

A contact hall is opened in the dielectric layer 50 to expose the conductor pattern 100a and an n-type electrode 47 is formed so as to connect to the n-type InP substrate 41 via the conductor pattern 100a.

Also in this avalanche photodiode, the dielectric layer pattern 50A maintains the original planarity of the surface of the p-type InP region 45 even after the formation of the close contact electrode 48₂. Therefore, light which enters the substrate 41 through an antireflection film 49 and reaches the cap layer 43 without being absorbed by the optical absorption layer 42, can be reflected back to the optical absorption layer 42 with high efficiency and absorbed there.

The avalanche photodiode according to this embodiment also may utilize the high reflecting layer 48₃ previously explained in the semiconductor photodiode devices 60 and 80.

[Seventh embodiment]

Figure 11:
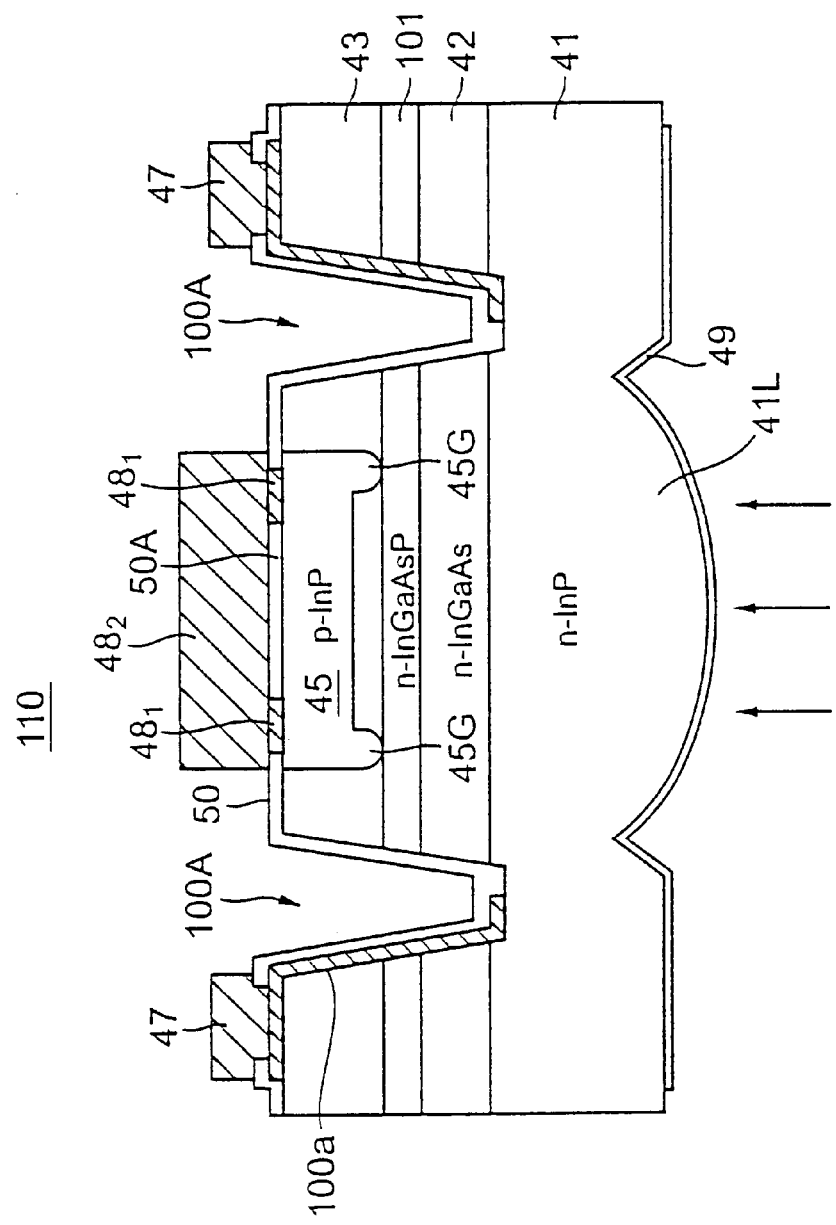
FIG. 11 is a cross-sectional view showing the construction of an avalanche photodiode according to a seventh embodiment of the present invention.

FIG. 11 shows the construction of a surface mounted type avalanche photodiode 110 according to a seventh embodiment of the present invention, wherein those parts corresponding to the parts described previously are designated by the same reference numerals and the description thereof will be omitted.

Referring to FIG. 11, the avalanche photodiode 110 has a lens-like condenser portion 41L formed at the bottom surface of an InP substrate 41. Therefore, a light signal incident to the device is efficiently condensed on the photodetection structure.

Other features of this embodiment are the same as those of the previous embodiment and the description thereof will be omitted.

[Eighth embodiment]

Figure 12:
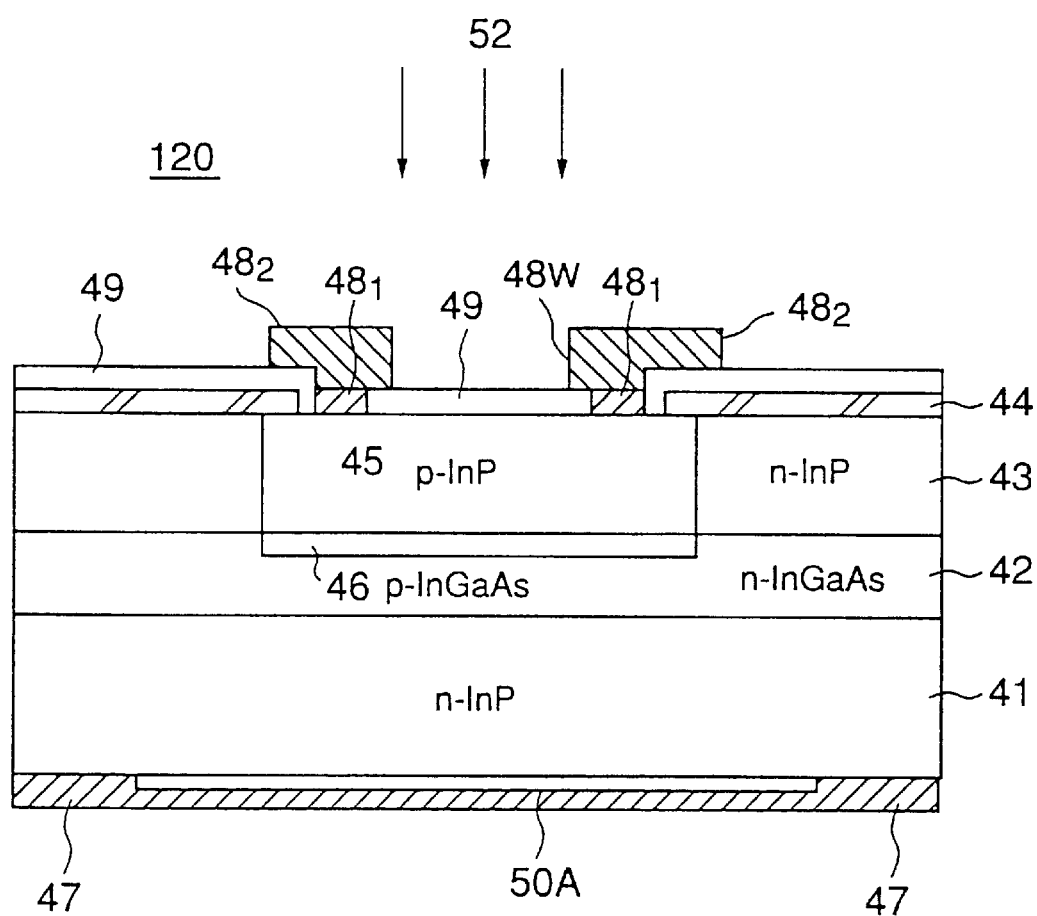
FIG. 12 is a cross-sectional view showing the construction of a semiconductor photodetection device according to an eighth embodiment of the present invention.

FIG. 12 shows the construction of a semiconductor photodetection device 120 of a type that receives incoming optical signals at a top surface side according to an eighth embodiment of the present invention, wherein those parts corresponding to the parts described previously are designated by the same reference numerals and the description thereof will be omitted.

Referring to FIG. 12, the surface-incident type semiconductor photodetection device 120 has a general construction similar to the semiconductor photodetection device 40 shown in FIG. 5, but the dielectric layer 50 and the dielectric layer pattern 50A are replaced by an antireflection film 49, and an opening 48W is made in a closed contact electrode 48₂ to expose the antireflection film 49.

In the surface-incident type semiconductor photodetection device 120 shown in FIG. 12, a high reflecting dielectric layer pattern 50A is formed on the bottom surface of a substrate 41, and an n-type electrode 47 is formed at the bottom surface of the substrate 41 so as to cover the high reflecting layer pattern 50A.

In the operation of the semiconductor photodetection device 120, an incident light 52 passes through the antireflection film 49 after passing through a window 48W in the close contact electrode 48₂, and is then absorbed by an optical absorption layer 42. A part of the incident light beam which has not been absorbed is reflected by the high reflecting layer 50A formed on the bottom surface of the substrate 41 and returned to the optical absorption layer 42. Because the dielectric layer 50A is formed between the bottom surface of the substrate 41 and the n-type electrode 47, no alloy is created between them, and therefore an excellent reflecting surface is maintained there.

[Ninth embodiment]

Figure 13:
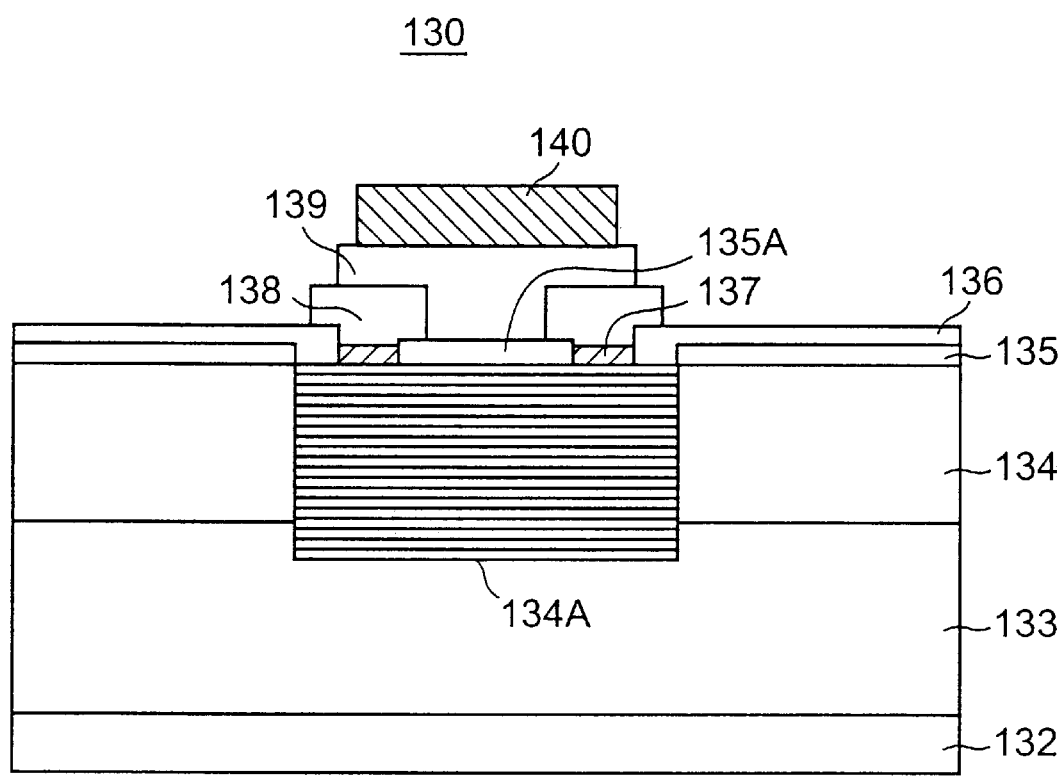
FIG. 13 is a cross-sectional view showing the construction of a photodetection area of a semiconductor photodetection device according to a ninth embodiment of the present invention.

FIG. 13 is an enlarged cross-sectional view of a photodetection area of a substrate-incident type semiconductor photodetection device 130 according to a ninth embodiment of the present invention. A semiconductor substrate and electrodes are not shown in FIG. 13.

Referring to FIG. 13, the semiconductor photodetection device 130 includes an epitaxially formed n-type InP layer 132 having a carrier concentration of $2 \times 10^{17}$ cm$^{-3}$ and a thickness of 1.5 $\mu$m, an n-type InGaAs optical absorption layer 133 formed epitaxially on the InP layer 132 and having a carrier concentration of $5.5 \times 10^{14}$ cm$^{-3}$ and a thickness of 2 $\mu$m, and an n-type InP layer 134 formed epitaxially on the optical absorption layer 133 and having a carrier concentration of $6 \times 10^{15}$ cm$^{-3}$ and a thickness of 1.5 $\mu$m. A p-type region 134A including Zn, Cd, Be or similar substance is formed in the InP layer 134 so as to reach the optical absorption layer 133.

A insulating layer 135 of SiN layer or similar substance is formed typically by the CVD method on the InP layer 134 and an opening is made in the insulating layer 135 to expose the p-type region 134A. A SiN or SiO₂ dielectric layer 136 having an optical thickness set up in ¼ of a signal light wavelength is formed typically by the CVD method on the insulating layer 135. The p-type region 134A is formed by introducing p-type impurity atoms through the opening in insulating layer 135 and thermally diffusing them.

Dielectric layer 136 is then patterned, and a dielectric layer 135A is formed as a mirror on the p-type region 134A, separated from the dielectric layer 136 by a ring-shaped trench. In the ring-shaped trench is formed a ring-shaped Au/Zn/Au electrode pattern 137 ohmic-contacting with the p-type region 134A, by the lifting-off method.

In this embodiment, a ring-shaped barrier pattern 138 is formed on the ring-shaped Au/Zn/An electrode pattern 137 by laminating Ti and Pt layers in turn. An Au pillar 139 is formed on the ring-shaped barrier pattern 138 by plating and lifting-off method, so as to contact with the dielectric pattern 135A. A bump electrode 140 of Au/Sn alloy metal is formed on the Au pillar 139.

In this semiconductor photodetection device, the ring-shaped electrode pattern 137 ohmic-contacts with p-type diffusion region 134A and the planarity of their interface gets worse. However, the interface between the dielectric mirror pattern 135A and the p-type diffusion region 134A is planar providing an area, where the light signal is well reflected.

In this embodiment, the Au pillar 139 functions a refection mirror together with the dielectric mirror pattern 135A. The Au pillar 139 does not adhere well to the dielectric mirror pattern 135A, but adheres well to the ring-shaped barrier pattern 138 and therefore the Au pillar 139 is prevented from peeling off. As previously explained, the Ti atom has many most outer-shell electrons, and is strongly bonded to other elements. On the other hand, Pt functions as a diffusion barrier, which inhibits Au in the Au pillar 139 from diffusing into the p-type diffusion region 134A. In this structure, stable reflectivity is obtained even when the semiconductor photodetection device 130 suffers thermal stress.

In this embodiment, a TiW layer or TiN layer can be used as the ring-shaped barrier pattern 138, instead of Ti/Pt laminated layers. Further, instead of Au, another transition metal element belonging to group 1B or 2B such as Ag or Cu or group 3B such as Al can be used for the pillar 139.

Figure 14:
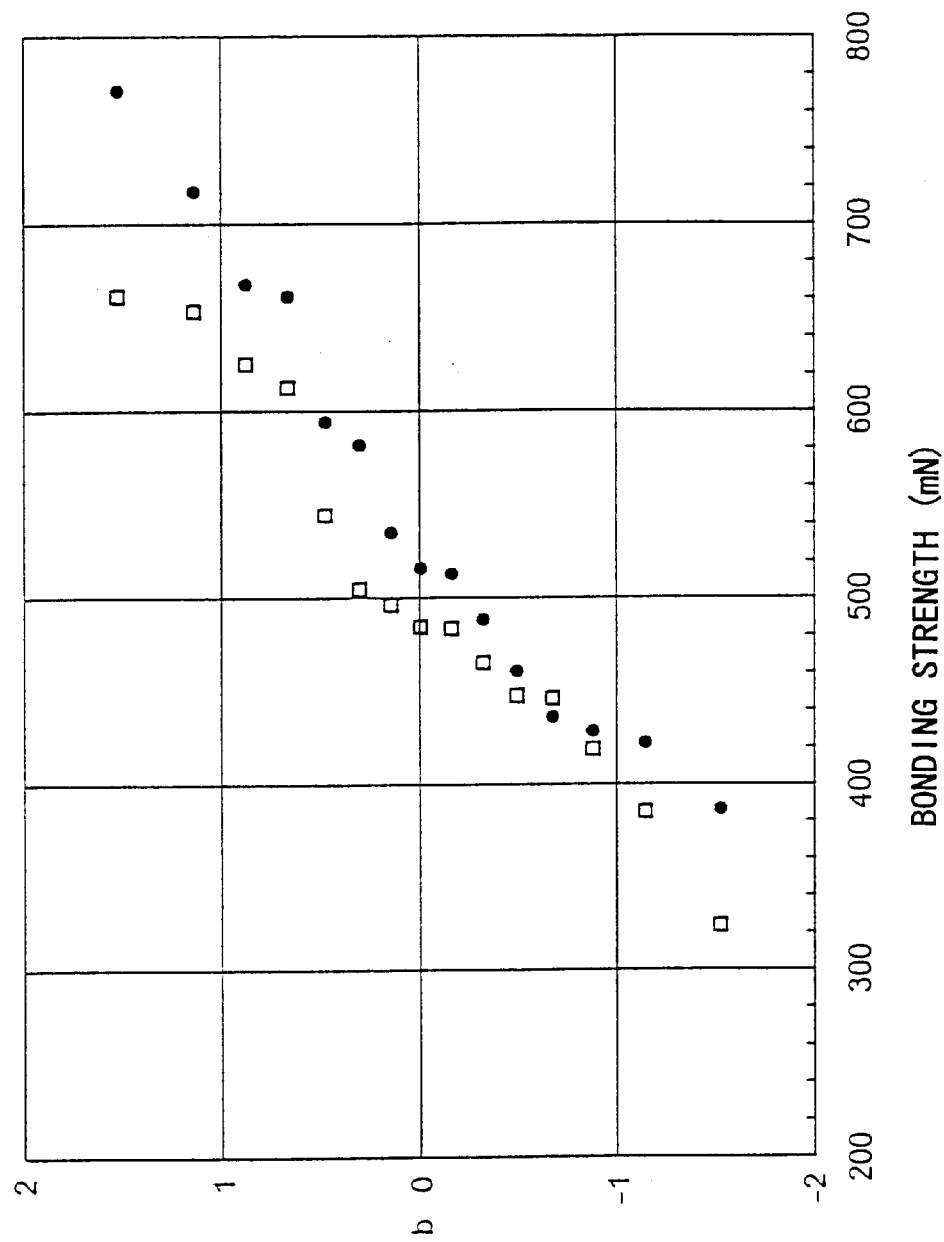
FIG. 14 is a chart showing bonding strengths of the semiconductor photodetection device shown in FIG. 9.

FIG. 14 shows the results of a chip bonding strength test performed on the semiconductor photodetection device 130.

Referring to FIG. 14, □ (a square) represents the result of testing the conventional semiconductor photodetection device, ● (a solid circle) represents the result of testing the semiconductor photodetection device 130.

It can be seen from FIG. 14 that the bonding strength of this embodiment, semiconductor photodetection device 130, is similar to or better than that of the conventional semiconductor photodetection device.

[Tenth embodiment]

Figure 15:
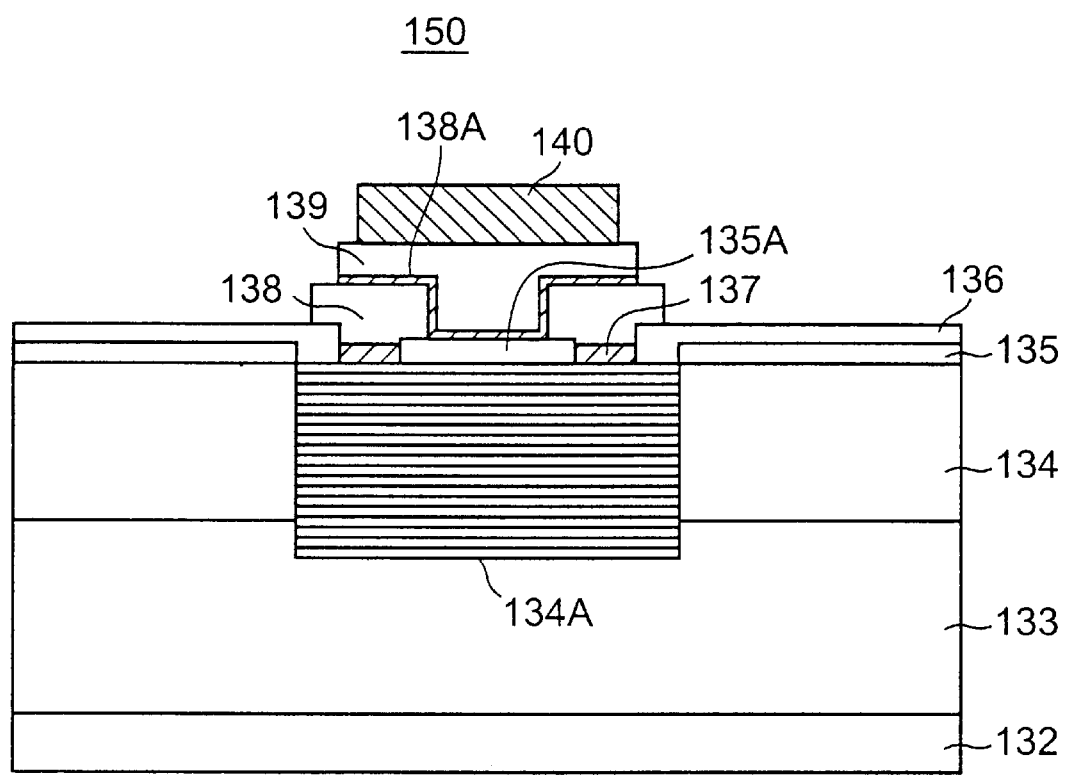
FIG. 15 is a cross-sectional view showing the construction of a photodetection area of a semiconductor photodetection device according to a tenth embodiment of the present invention.

FIG. 15 shows the construction of a semiconductor photodetection device 150 according to a tenth embodiment of the present invention, wherein those parts corresponding to the parts described previously are designated by the same reference numerals and the description thereof will be omitted.

Referring to FIG. 15, a Ti close contact layer 138A is interposed between a ring-shaped barrier layer pattern 138 and an Au pillar 139 and between a dielectric mirror pattern 135A and the Au pillar 139. This Ti close contact layer makes the bonding strength of the semiconductor photodetection device 150 stronger.

As previously explained, the Ti layer absorbs light at the operational wavelength of the semiconductor photodetection device 150. Therefore, the thickness of the Ti close contact layer 138A is arranged to be thinner than the absorption length (the inverse number of absorption coefficient of the Ti layer.

Figure 16:
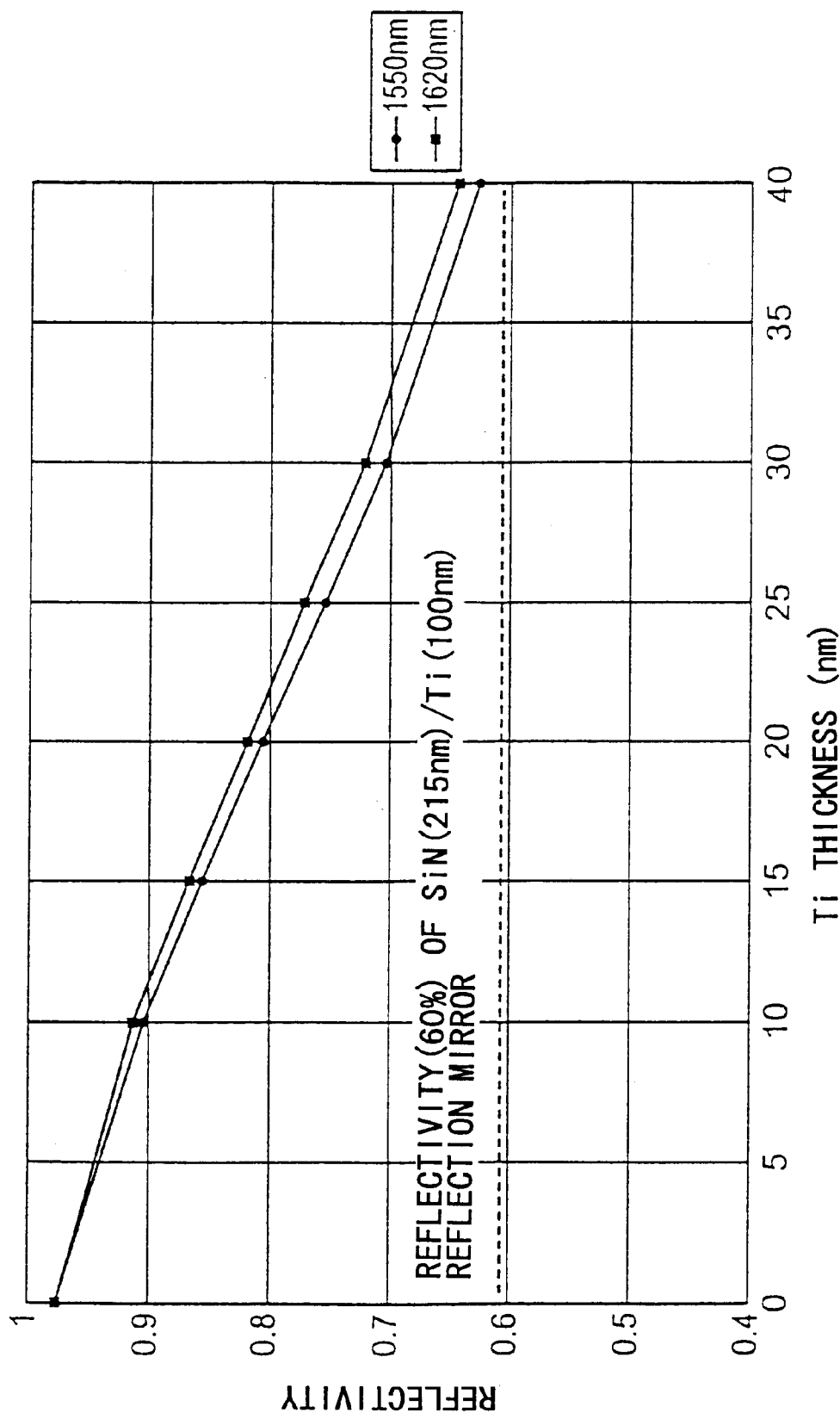
FIG. 16 is a chart showing the relationship between reflectivities and thicknesses of a Ti close contact layer of the semiconductor photodetection device shown in FIG. 15.

FIG. 16 shows the relationships between the thicknesses and reflectivities at 1550 nm and 1620 nm wavelengths.

Referring to FIG. 16, it can been seen that the reflectivity decreases as the Ti layer gets thicker. The thickness of the Ti layer should be less than 40 nm in order to obtain a desirable reflectivity that is equal to or better than the reflectivity (60%) of a conventional reflection mirror having a laminated 100 nm Ti layer and 215 nm SIN layer.

Accordingly, in the embodiment shown in FIG. 15, the thickness of the close contact layer 138A is preferably less than 40 nm. For example, a close contact layer 138A having a thickness of 30 nm gives a reflectivity higher than prior devices.

[Eleventh embodiment]

Figure 17:
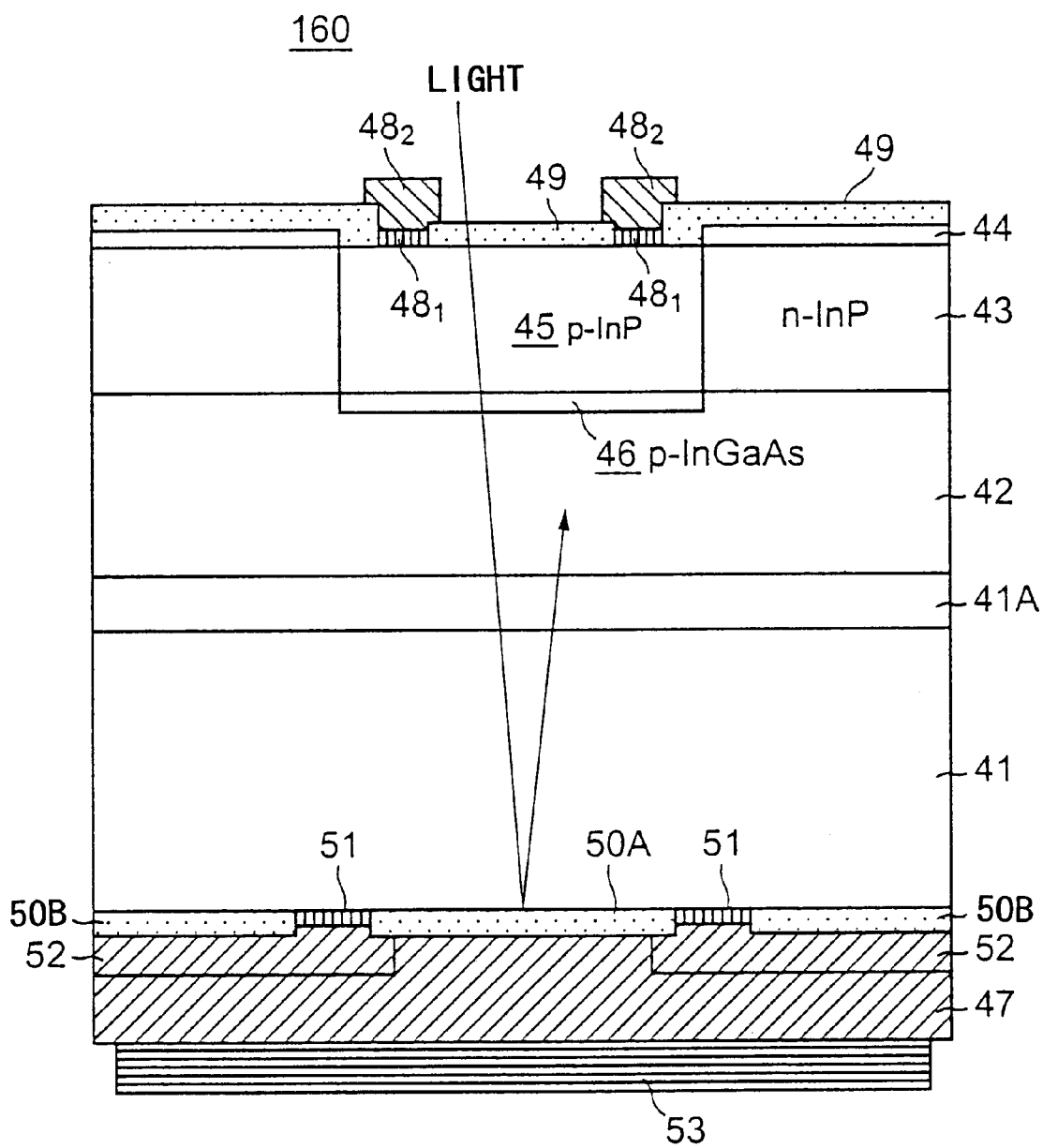
FIG. 17 is a cross-sectional view showing the construction of a semiconductor photodetection device according to an eleventh embodiment of the present invention.

FIG. 17 shows the construction of a semiconductor photodetection device 160 according to an eleventh embodiment of the present invention, wherein those parts corresponding to the parts described previously are designated by the same reference numerals and the description thereof will be omitted.

Referring to FIG. 17, a dielectric layer mirror pattern 50A and a dielectric layer pattern 50B are formed on the bottom surface of a substrate 41 by patterning dielectric layers thereon. A ring-shaped Au/Ge/Au ohmic electrode 51 is formed in a ring-shaped groove between the dielectric layer mirror pattern 50A and the dielectric layer pattern 50B.

A ring-shaped Ti/Pt barrier electron pattern 52 is formed so as to cross-link the dielectric layer mirror pattern 50A and the dielectric layer pattern 50B and to directly contact with the ring-shaped ohmic electrode 51 interposed between them. An Au electrode 47 is formed on the barrier electrode pattern 52 so as to contact with the dielectric reflection pattern 50A through an opening made in the barrier electrode pattern 52. A bump electrode 53 for mounting purposes is formed on the Au electrode 47. In this embodiment, the electrode 47 may be made of transition metal belonging to group 1B or 2B such as Ag or Cu, which absorbs less light. An n-type InP buffer layer 41A is interposed between the InP substrate 41 and the InGaAs optical absorption layer 42.

In the thus structured semiconductor photodetection device 160, incident light comes through a dielectric layer 49 into the substrate 41, and is reflected by the dielectric mirror pattern 50A and absorbed by an optical absorption layer 42.

In this embodiment, because the Ti/Pt barrier electrode 52 is formed on the dielectric layer patterns 50A, SOB and connected to the Au electrode 47, the weak adhesion between the Au electrode 47 and the dielectric layer mirror 50A is compensated for, and therefore the semiconductor photodetection device 160 can be reliably mounted on a circuit board. Because there is no ohmic contact between the dielectric layer mirror pattern 50A and the substrate 41, high reflectivity is attained.

[Twelfth embodiment]

Figure 18:
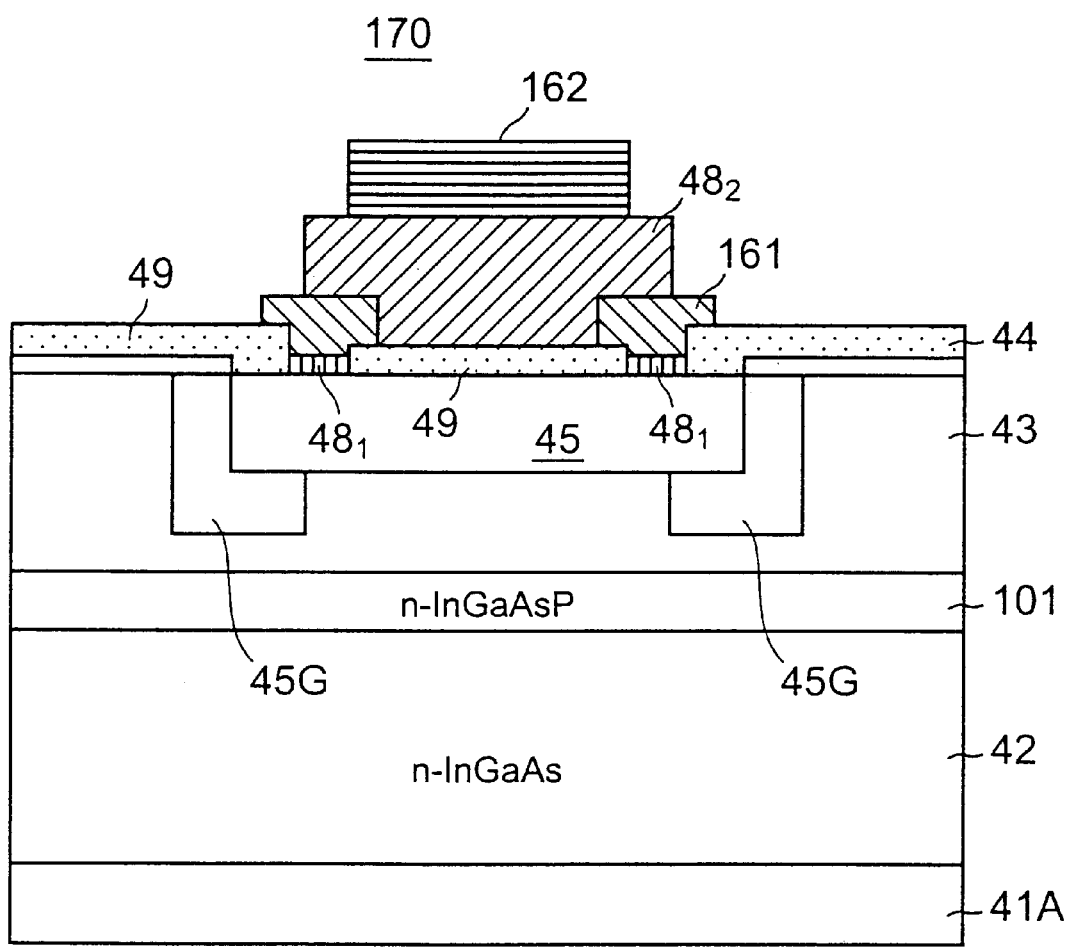
FIG. 18 is a cross-sectional view showing the construction of a photodetection area of a semiconductor photodetection device according to a twelfth embodiment of the present invention.

FIG. 18 is an enlarged cross-sectional view of a photodetection area of a surface mounting type avalanche photodiode 170 according to a twelfth embodiment of the present invention, wherein those parts corresponding to the parts described previously are designated by the same reference numerals and the description thereof will be omitted.

Referring to FIG. 18, the avalanche photodiode 170 has a structure similar to that of the previously explained avalanche photodiode 100 shown in FIG. 10, but is different in the following ways. An electrode $48_2$ is made of transition metal belonging to group 1B or 2B such as Au, Ag or Cu which absorbs less light. A Ti/Pt barrier electrode 161 is interposed between the ohmic electrode $48_1$ and the Au layer $48_2$. An Au/Sn bump for mounting purposes is formed on the electrode $48_2$. An n-type InP buffer layer 41A is interposed between a substrate (not shown) and an InGaAs layer 42.

Thus structured the avalanche photodiode 170 can be reliably flip-chip-mounted on a circuit board with high strength. A Ti layer that absorbs light is used only for the barrier electrode 161, and therefor the reflectivity of the reflecting region including the dielectric layer mirror 49 is not lowered.

Each embodiment explained above is a planar type device in which p-type semiconductors are made by diffusing impurities. However, the present invention can be applied to a mesa-type device. Conducting types can be reversed from p-type to n-type in each embodiment above. Although the above-explained embodiments are based on III-V compound semiconductor, the present invention can be applied to other types of semiconductors such as Si or Ge.

Further, the present invention is not limited to the embodiments described heretofore but various variations and modifications may be made without departing from the scope of the invention.

According to the present invention as set forth above, it becomes possible to obtain high adhesive strength of the electrodes including the contact electrode and the close contact electrode, and avoid the contact electrode peeling-off problem during the manufacturing process or packaging and mounting processes including a wire bonding process. Further, it becomes possible to planarize the light reflection surface and improve the reflectivity. Further, in the case of using a metal layer as a reflection mirror, the thickness of layers becomes small. As a result, the step coverage problem when forming electrodes is alleviated and the throughput and reliability when manufacturing this device is much improved.

What is claimed is:

1. A semiconductor photodetection device, comprising:
 a semiconductor structure including an optical absorption layer having a photo-incidence surface on a first side thereof;
 a dielectric reflecting layer formed on a second side of the semiconductor structure opposite to the first side;
 a contact electrode surrounding the dielectric reflecting layer and contacting with the semiconductor structure;
 a barrier electrode formed on the periphery of the dielectric reflecting layer; and a reflecting electrode covering the dielectric reflecting layer and contacting with the barrier electrode and the dielectric reflecting layer.

2. A semiconductor photodetection device as claimed in claim 1, wherein said dielectric reflecting layer is made of fluoride, oxide or nitride including one or more atoms selected from the group consisting of Si, Al, Mg, Ti, Zr and Ta.

3. A semiconductor photodetection device as claimed in claim 1, further comprises one or more additional reflecting layers made of a dielectric or semiconductor material on the dielectric reflecting layer.

4. A semiconductor photodetection device as claimed in claim 3, wherein said additional reflecting layers are dielectric layers comprising fluoride, oxide or nitride including one or more atoms selected from the group consisting of Si, Al, Mg, Ti, Zr and Ta, or semiconductor layers including Si or Ge.

5. A semiconductor photodetection device as claimed in claim 3, wherein said dielectric reflecting layer has a refractive index of $n_1$ and said additional reflecting layers have a refractive index of $n_2$ where $n_2 > n_1$.

6. A semiconductor photodetection device as claimed in claim 1, wherein said reflecting electrode includes transition metal belonging to group 1B or 2B.

7. A semiconductor photodetection device as claimed in claim 1, wherein said reflecting electrode comprises a first metal reflecting layer having a thickness less than the absorption length for a wavelength of an optical signal, and a second metal reflecting layer formed on the first metal reflecting layer.

8. A semiconductor photodetection device as claimed in claim 7, wherein said first metal reflecting layer includes transition metal belonging to any of groups 3B through 8B and said second metal reflecting layer includes transition metal belonging to group 1B or 2B.

9. A semiconductor photodetection device as claimed in claim 7, wherein said first metal reflecting layer includes one or more elements selected from the group consisting of Pt, Ni, TiW and TiN, and said second metal reflecting layer includes one or more atoms selected from the group consisting of Au, Ag and Cu.

10. A semiconductor photodetection device as claimed in claim 1, wherein said barrier electrode has a larger area than the contact electrode.

11. A semiconductor photodetection device as claimed in claim 1, wherein said contact electrode is of a ring shape.

12. A semiconductor photodetection device as claimed in claim 1, wherein said contact electrode is formed partially surrounding the dielectric reflecting layer.

13. A semiconductor photodetection device as claimed in claim 1, wherein said semiconductor structure is mounted on a semiconductor substrate and the photo-incidence surface is placed on the substrate side of the semiconductor structure.

14. A semiconductor photodetection device as claimed in claim 1, wherein said semiconductor structure is mounted on a semiconductor substrate and the photo-incidence surface is placed on a side opposite to the substrate of the semiconductor structure.

15. A semiconductor photodetection device as claimed in claim 1, wherein said semiconductor structure further includes a carrier-multiplier layer, and said semiconductor photodetection device is an avalanche photodiode.

16. A semiconductor photodetection device as claimed in claim 11, wherein said dielectric reflecting layer is inside the contact electrode, and said barrier electrode is mounted to the semiconductor structure outside of the contact electrode.

* * * * *